United States Patent
Jackson et al.

[19]

[11] Patent Number: 5,933,004

[45] Date of Patent: Aug. 3, 1999

[54] LOW PROFILE MODULAR REVENUE METER

[75] Inventors: Philip L. Jackson; Thomas P. Houck, both of West Lafayette; John T. Voisine, Lafayette, all of Ind.

[73] Assignee: Siemens Power Transmission & Distribution, LLC, Wendell, N.C.

[21] Appl. No.: 08/862,844

[22] Filed: May 23, 1997

Related U.S. Application Data

[60] Provisional application No. 60/018,201, May 23, 1996.

[51] Int. Cl.$^6$ .................................................... G01R 11/32
[52] U.S. Cl. .......................... 324/142; 324/110; 324/156
[58] Field of Search .............................. 324/103 R, 107, 324/110, 127, 141, 142, 156; 361/641, 657, 659, 664, 666, 668, 669, 671, 672; 702/60, 61, 62, 64, 65

[56] References Cited

U.S. PATENT DOCUMENTS

| | | | |
|---|---|---|---|
| 2,047,384 | 4/1936 | Richterkessing | 361/669 |
| 3,355,630 | 11/1967 | Orr | 361/669 |
| 4,175,813 | 11/1979 | Mentesana | 324/110 |
| 4,258,968 | 3/1981 | Holt | 439/108 |
| 5,039,936 | 8/1991 | Gonzales | 324/110 |
| 5,041,001 | 8/1991 | Giles | 361/372 |
| 5,196,783 | 3/1993 | Howell | 324/110 |
| 5,315,236 | 5/1994 | Lee | 324/142 |

*Primary Examiner*—Diep N. Do

[57] ABSTRACT

An electronic utility meter includes a sensor module and a removable measurement module. The sensor module connects to the electrical system of a facility and includes voltage and current sensors. The voltage and current sensors is operable to receive voltage and current signals from the electrical system and generate measurement signals therefrom. The sensor module further includes an electrically safe interface. The removable measurement module includes a measurement circuit operable to receive measurement signals and generate energy consumption data therefrom. The measurement module also includes a device for communicating information relating to the energy consumption data. The electrically safe interface of the sensor module operably connects the voltage and current sensors to the measurement circuit, and further prevents physical contact of a human operator with the received voltage and current signals from the electrical system when the measurement module is removed from the sensor circuit.

29 Claims, 6 Drawing Sheets

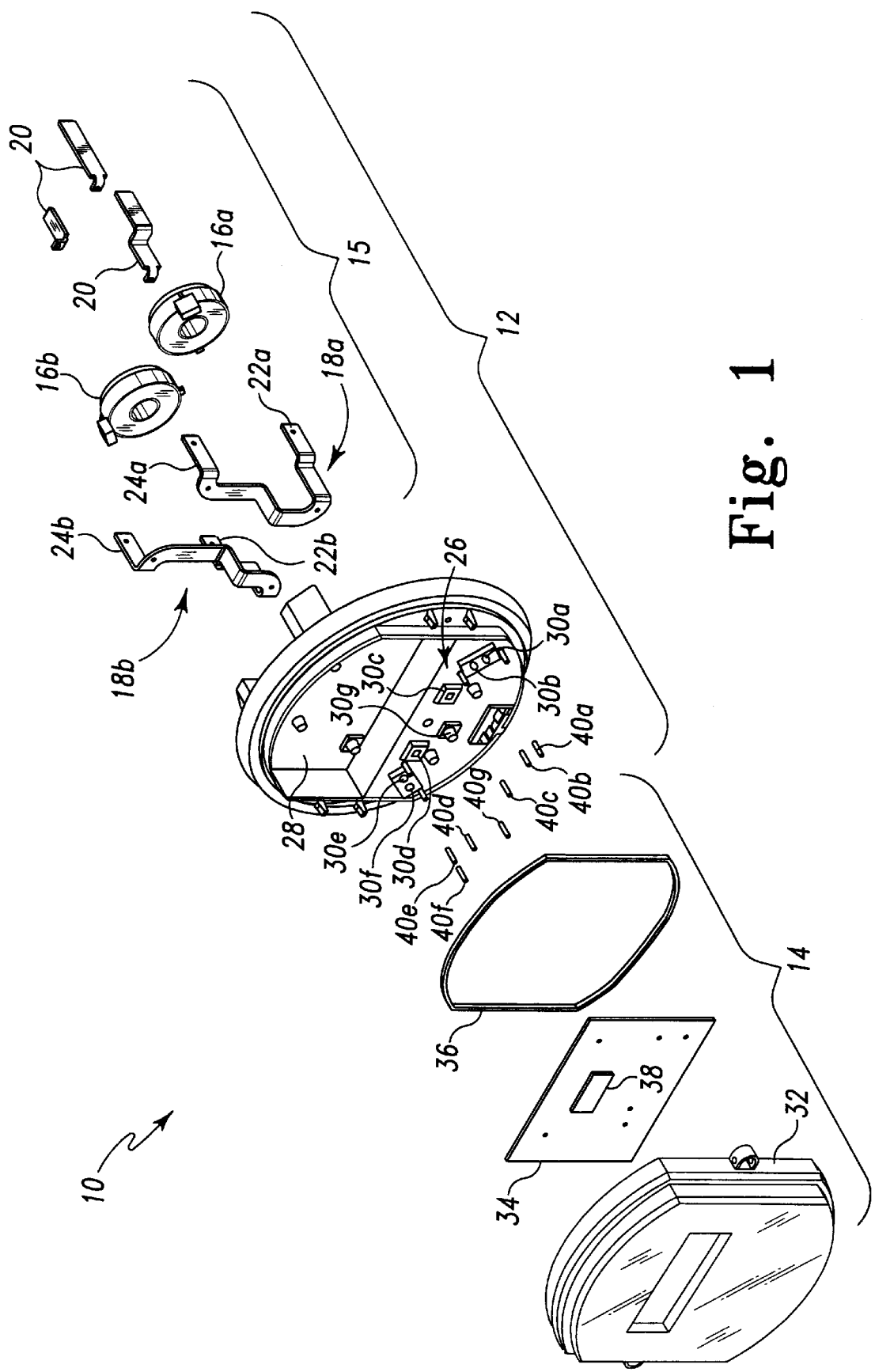

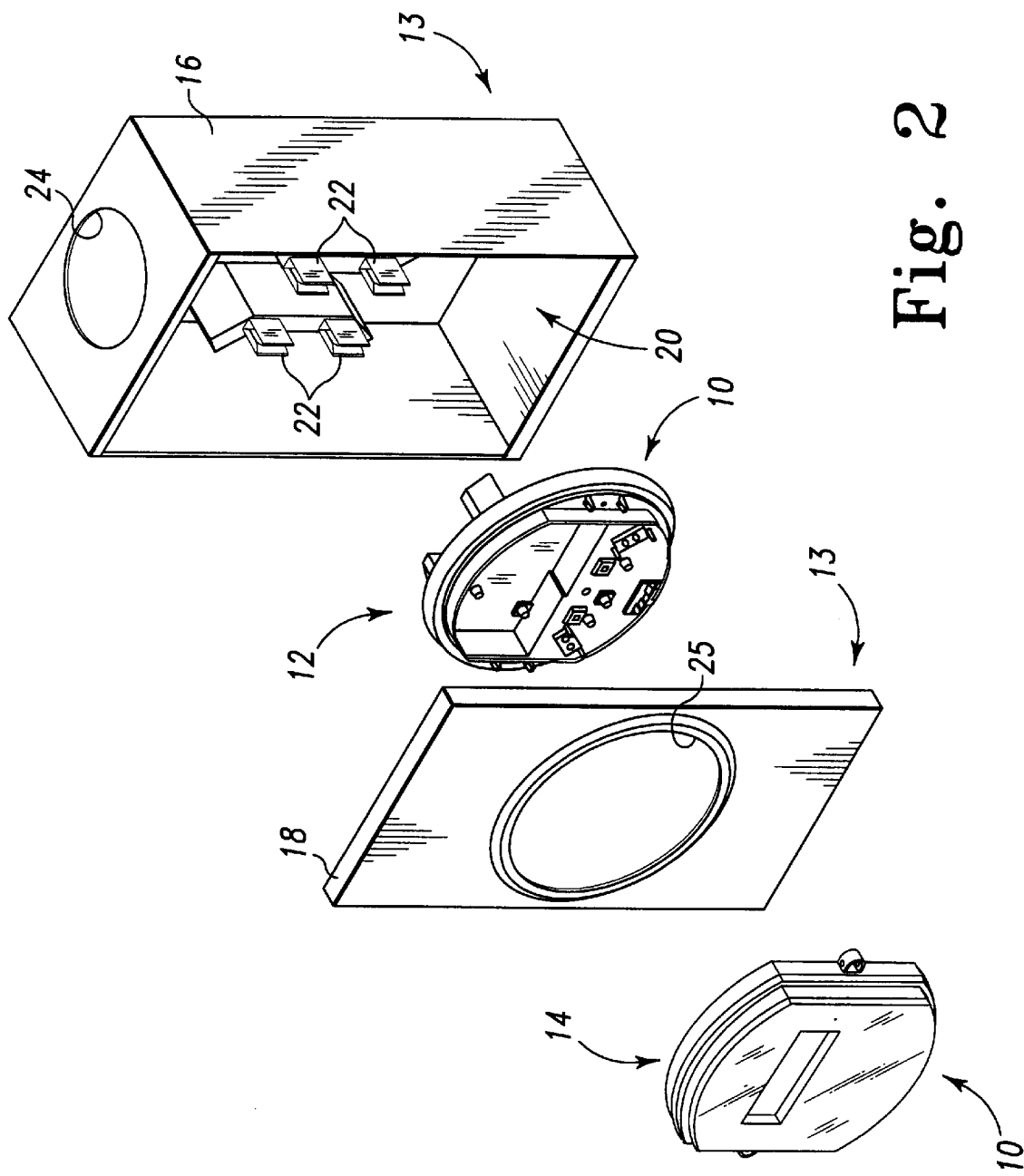

LOW PROFILE MODULAR REVENUE METER

CROSS REFERENCE TO RELATED APPLICATION

This is a continuation-in-part of U.S. patent application Ser. No. 60/018,201, filed May 23, 1996

BACKGROUND OF THE INVENTION

The present invention relates generally to the field of metering devices, and in particular, to electrical utility revenue meters.

Electrical utility revenue meters, or simply revenue meters, are devices that, among other things, measure electrical energy consumed by a residence, factory, commercial establishment or other such facility. Electrical utilities rely on revenue meters for many purposes, including billing customers and tracking demand for electrical power. A common form of revenue meter comprises an inductive drive that rotates a spinning disk at an angular velocity proportional to the amount of power being consumed. The spinning disk drives mechanical counters that provided an indication of power consumed over time.

Over recent years, electronic meters have been developed that are replacing the spinning disk meter design in several applications. Electronic meters use electronic circuits to measure, quantify and display energy consumption information. In general, electronic meters may be divided into two portions, a sensor portion and a measurement portion. The sensor portion includes sensor devices that are connected to the electrical system of a facility, and more particularly, to the power lines. The sensor devices generate signals that are indicative of the voltage and current in the power lines. In general, the sensor portion of a revenue meter operates with the high voltages and currents that are present on the power lines.

The measurement portion of an electronic meter uses the signals generated by the sensor portion to determine watt-hours, VA, VAR and other information that quantifies the power consumed by the facility. The measurement portion typically also includes a display for displaying the power consumption information. In contrast to the sensor portion, the measurement circuit works with reduced or attenuated voltage and current signals that are compatible with electronic devices, and in particular, digital electronic devices.

Occasionally, revenue meters can malfunction or suffer damage through external forces and require repair or replacement. Repair or replacement of many commonly-used revenue meters presently require an interruption in the electrical power to the facility being metered. In general, power service interruptions are extremely undesirable from the electrical utilities' perspective because they reduce customer satisfaction. Accordingly, there exists a need for a revenue meter that may be repaired or replaced without interrupting power service to the facility being metered.

Another problem that has arisen due to the advent of electronic meters pertains to service upgrades. In general, electronic meters offer a wide variety of features that are facilitated by digital electronics. These features may include power demand monitoring, communications, and power line and meter diagnostics. Because these feature are facilitated by the digital circuitry in the measurement portion of the meter, the services or functions available in an electronic-type revenue meter may be altered by replacing digital circuit components in the measurement portion of the meter.

For example, consider a utility that installs several electronic meters without power demand monitoring because it is deemed unnecessary at the time of installation. A year later that utility may determine that it would be desirable to have the power demand monitoring capability in those meter installations. The installed electronic meters may, in theory, be upgraded to provide that capability typically by replacing portions of the electronic portion. The sensor portion components would not need to be replaced.

As a practical matter, however, it is often more convenient to replace the entire meter rather than the individual digital circuit components. Accordingly, enhancement of the capabilities of the metering often requires replacement of the entire meter. Replacement of the entire meter, however, undesirably creates waste by forcing the replacement of relatively costly, and perfectly operable, sensor components.

A meter introduced by Asea Bover & Brown ("ABB") addresses this concern by providing a modular meter that includes a sensor portion and a removable measurement portion. The measurement portion may be removed from the sensor module and replaced with another measurement portion having enhanced functionality. The ABB meter, however, has significant drawbacks. For example, the measurement portion of the ABB meter can not be replaced while the sensor portion is connected to an electrical system of a facility because removal of the measurement portion would expose extremely dangerous voltages and currents to a human operator or technician. Thus, although the modular design allows for upgrades, the power to the facility must nevertheless be interrupted to perform such upgrades for safety purposes.

A further problem with the ABB meter arises from its bulkiness. The sensor portion of the ABB meter is enclosed in housing and the measurement portion is enclosed in another housing. Both housings include large areas of unused space that increase the bulkiness of the meter. The bulkiness undesirably increases costs in shipping and storing of the meters both as assembled or in their modular components.

There exists a need, therefore, for a modular meter having modular components that may be removed or replaced without interruption to the electrical power service to the facility to which the meter is connected. There is also a need for a revenue meter having reduced bulkiness.

SUMMARY OF THE INVENTION

The present invention overcomes the above stated needs, as well as others, by providing a modular safety meter comprising a sensor module, a measurement module, and an electrically safe interface. The electrically safe interface allows the measurement module to be removed from sensor module without exposing dangerous electrical voltages. The present invention further provides a novel configuration of circuit components that reduce the thickness or bulkiness of the meter.

An exemplary embodiment of the present invention is an electronic utility meter comprising a sensor module and a removable measurement module. The sensor module connects to the electrical system of a facility, said sensor module including voltage and current sensing means. The voltage and current sensing means are operable to receive voltage and current signals from the electrical system and generate measurement signals therefrom. The sensor module further includes first interconnecting means, which includes an electrically safe interface.

The removable measurement module includes a measurement circuit operable to receive measurement signals and generate energy consumption data therefrom. The measurement module also includes a means for communicating information relating to the energy consumption data. The measurement module further includes second interconnecting means. The first interconnecting means and the second interconnecting means cooperate to connect the measurement circuit to the voltage and current sensing means, wherein said first interconnecting means includes means for preventing physical contact of a human operator with the voltage and current sensing means.

The above discussed features and advantages, as well as others, may readily be ascertained by those of ordinary skill in the art by reference to the following detailed description and accompanying drawings.

BRIEF DESCRIPTION OF THE DRAWINGS

FIG. 1 shows an exploded view of an exemplary embodiment of a revenue meter according to the present invention;

FIG. 2 shows an installation configuration that includes the meter from FIG. 1, and a meter box comprising a housing and a cover;

DETAILED DESCRIPTION

Figure 1A:
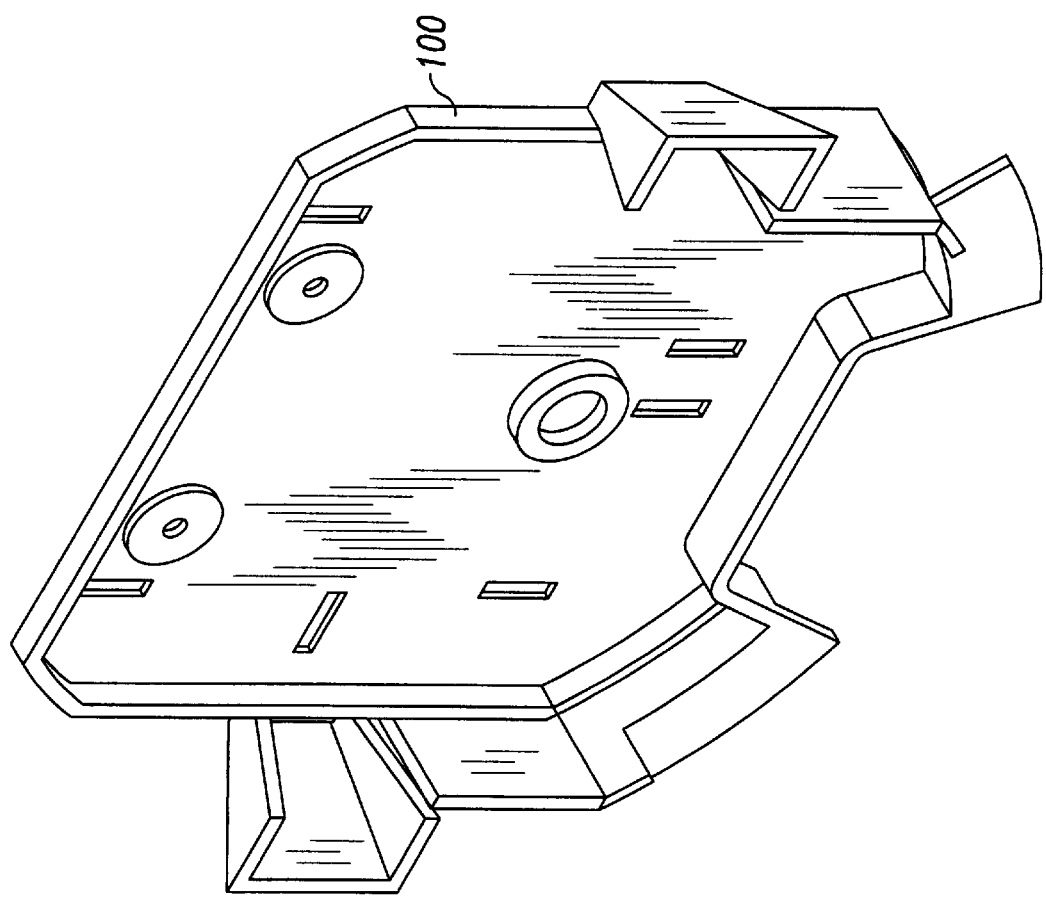
FIG. 1a shows an optional bottom structure for the meter of FIG. 1.

FIG. 1 shows an exploded view of an exemplary revenue meter 10 according to the present invention. The revenue meter 10 includes a sensor module 12 and a measurement module 14. The revenue meter 10 is constructed as described below such that the measurement module 14 is removable from the sensor module 12. The exemplary revenue meter 10 is a type of meter known in the revenue metering industry as a 12S meter form. The meter form relates to the application of the meter installation, for example, whether it is single phase or polyphase. In any event, it will be noted that the present invention is not limited to applications involving 12S meter forms, but may readily be incorporated into 2S, 8S/9S and other well known meter forms by those of ordinary skill in the art.

The sensor module 12 includes voltage and current sensing means, which according to the exemplary embodiment described herein, includes first and second current transformers 16a and 16b, respectively, first and second current coils 18a and 18b, respectively, and one or more neutral blades 20. The first current coil 18a includes first and second ends defining first and second current blades 22a and 24a, respectively, to be received by the jaws of a compatible meter socket. (See FIG. 2) The second current coil 18b likewise includes first and second ends defining first and second current blades 22b and 24b, respectively, to be received by the jaws of compatible meter socket. (See FIG. 2)

The first and second current transformers 16a and 16b, respectively, are preferably toroidal transformers having a substantially circular shape defined by a circular core. In the present embodiment, the first current transformer 16a has a turns ratio of N1 and the second current transformer has a turns ratio of N2. Using such toroidal current transformers, the first current coil 18a, when assembled, passes through the interior of the toroid of the first current transformer 16a. Preferably, the current transformer 16a is arranged such that the axial dimension of the current transformer 16a is substantially parallel to the axial dimension of the sensor module 12. In other words, the current transformer 16a is horizontally-disposed within the sensor module 12. The second current transformer 16b and the second current coil 18b are preferably arranged in a similar manner within the sensor module 12. Accordingly, the second current transformer 16b is also horizontally disposed within the sensor module 12. The use of horizontally disposed toroidal current transformers reduces the thickness and thus reduces the overall bulk of the meter 10.

The sensor module 12 further includes an electrically safe interface 26. The electrically safe interface 26 comprises a first interconnecting means for connecting to the measurement module 14. The electrically safe interface 26 also includes means for preventing physical contact of a human operator with potentially hazardous electrical signals present on at least a portion of the voltage and current sensing means 15. Signal levels which are considered potentially hazardous are well-known. Different levels of potential hazard also exist. For example, signals capable of generating shock currents exceeding 70 milliamperes are possibile burn hazards, while signals generating shock currents on the order of 300 milliamperes may constitute life threatening hazards. Furthermore, signals generating shock currents as low as 0.5 to 5 milliamperes are known to cause an involuntary startle reaction.

In revenue meters, including the meter 10 of the present invention, at least some of the sensor devices carry such potentially hazardous electrical signals. Specifically, any portion of the sensor module 12 that is electrically connected to the voltage and current signals from the power line is a life threatening hazard and must be isolated from human contact by the electrically safe interface 26. In the present embodiment, the current coils 18a and 18b are directly connected to the facility power line and therefore must be isolated. By contrast, the current transformers 16a and 16b, do not necessarily carry life threatening currents because, as discussed later, the current transformers 16a and 16b are not directly coupled to the facility power lines. Accordingly, depending on the highest level of expected current flowing through the current transformers 16a and 16b, the current transformers 16a and 16b may or may not carry potentially hazardous electrical signals. In any event, however, the electrically safe interface 26 preferably prevents human contact with the entire voltage and current density means 15 as a safety measure.

In the present embodiment, the means for preventing physical contact includes a top plate 28, and a plurality of sockets 30a, 30b, 30c, 30d, 30e, 30f and 30g. Each of the sockets 30a through 30g defines an opening in the top plate 28. Other than the openings defined by the sockets 30a through 30g, the top plate 28 preferably forms a complete barrier or wall from the measurement module 14 to the voltage and current sensing means 15.

Alternatively, at a minimum, the top plate 28 operates to prevent human contact with the portions of the voltage and current sensing means 15 that directly contact the power lines of the facility, and in Particular, the current coils 18a and 18b.

In order to provide a complete barrier, the top plate 28 cooperates with the meter mounting device or an alternative bottom structure that encloses the voltage and current sensing means 15 from the side and bottom. FIG. 1a shows an exemplary bottom structure 100 that may be used to cooperate with the top plate 28 of FIG. 1 to enclose the voltage and current sensing means 15. FIG. 2, discussed below describes an exemplary meter mounting device that may be used to cooperate with the top plate 28 to enclose the voltage and current sensing means 15.

In yet another alternative embodiment, the top plate 28 may be integral with a side structure or side and bottom structure that completely encases the voltage and current sensing means 15.

Referring again to FIG. 1, the sockets 30a through 30g and their corresponding openings are preferably configured to prevent a human operator from physically contacting the electrically conductive portions of the socket. In particular, the openings defined by the sockets 30a through 30g have sufficiently diminutive proportions to prevent contact of a standard test finger with the electrically conductive portions of the sockets 30a through 30g. A standard test finger is a mechanical device used in the electrical industry to determine whether an electrical connection socket is safe from accidental contact by a human finger. One standard test finger is described in Underwriter's Laboratory, Inc., Standard For Safety of Information Technology Equipment Including Electrical Equipment Business UL-1950 (Feb. 26, 1993).

In the present embodiment, the openings defined by the sockets 30a through 30g preferably have a first dimension, for example, the length, and a second dimension, for example, the width, wherein the first dimension has at least the same size as the second dimension, and the second dimension is less than ⅛ inch, thereby preventing substantial access of a human operator through the openings.

The measurement module 14 comprises a face cover 32, a printed circuit board 34, and a gasket 36. The printed circuit board 34 includes a display 38, and a measurement circuit FIG. 4, discussed further below, shows a schematic diagram of a measurement circuit 42 that may readily be used as the measurement circuit on the printed circuit board 34 of FIG. 1. The measurement circuit is operable to receive measurement signals and generate energy consumption data therefrom. The measurement circuit is operably connected to provide the energy consumption data to the display 38.

The measurement module 14 further includes second interconnecting means operable to cooperate with first interconnecting means (on the sensor module 12) to connect the measurement circuit of the printed circuit board 34 to the voltage and current sensing means 15. For example, in the present embodiment, the measurement module 14 includes a plurality of plugs 40a through 40g that are received by the corresponding plurality of sockets 30a through 30g. The plurality of plugs 40a through 40g, when assembled, are electrically connected to the measurement circuit as described further below in connection with FIG. 4, and physically connected to the printed circuit board 34.

FIG. 2 shows an installation configuration that includes the meter 10 and a meter box 13 comprising a housing 16 and a cover 18. The housing 16 is box-like in structure having an opening for receiving the cover 18 and a cabling opening 24 for receiving the power lines of the electrical system being metered, not shown. It will be appreciated that the housing 16 need not be box-like in structure, and that any other suitable shape may be used, as long as there is an opening for receiving a cooperating meter box cover and a cabling opening. The housing 16 further includes an interior 20. Within the interior 20 are located a plurality of jaws 22 constructed of electrically conductive material. When installed into a facility, the plurality of jaws 22 are electrically connected to the power lines of the electrical system of the facility, not shown.

The plurality of jaws 22 receive and provide electrical connection to the current coil blades 22a, 24a, 22b and 24b (see FIG. 1) as well as the neutral blade or blades 20. The relationship of the jaws and the blades 22a, 24a, 22b, and 24b also define the alignment of the sensor module 12 within the housing 16. Once the blades 22a, 24a, 22b, and 24b (see FIG. 1) are engaged with the plurality of jaws 22 (FIG. 2), then the sensor module 12 is installed within the interior 20 of the housing 16. The cover 18 is then installed onto the housing 16. The cover 18 includes a meter opening 25 having a perimeter defined by the perimeter of the sensor module 12. Preferably, the perimeter of the meter opening 25 has substantially the same shape and is slightly smaller than the perimeter of the sensor module 12 such that the sensor module 12 cannot be removed when the cover 18 is engaged with the housing 16.

Once the cover 18 is installed, the measurement module 14 in the present embodiment is placed in engagement with the sensor module 12 through the meter opening 25 of the meter box cover 18. When in engagement, the plugs 40a through 40g of the measurement module 14 are electrically connected to the sockets 30a through 30g, respectively, of the sensor module 12. (See FIG. 1). Once the measurement module 14, cover 18, sensor module 12 and housing 16 are all assembled as described above, the meter 10 (i.e., sensor module 12 and measurement module 14) performs energy consumption measurements on the electrical system of the facility.

The configuration of the meter box 13 in FIG. 2 is a standard mounting device known as a ringless-type mounting device. It will be noted that the meter 10 may readily be adapted for use in a ring-type mounting device. A ring-type mounting device differs from the meter box 13 in FIG. 2 in that the sensor module 12 would be installed after the meter box cover 18 is assembled onto the housing 16. An annular ring would then be used to secure the sensor module 12 to the meter box cover 18. To this end, the standard meter box cover for use in a ring type mounting device includes a feature annularly disposed around the opening 25 that cooperates with the annular ring to engage and secure the sensor 12 thereto.

Figure 3:
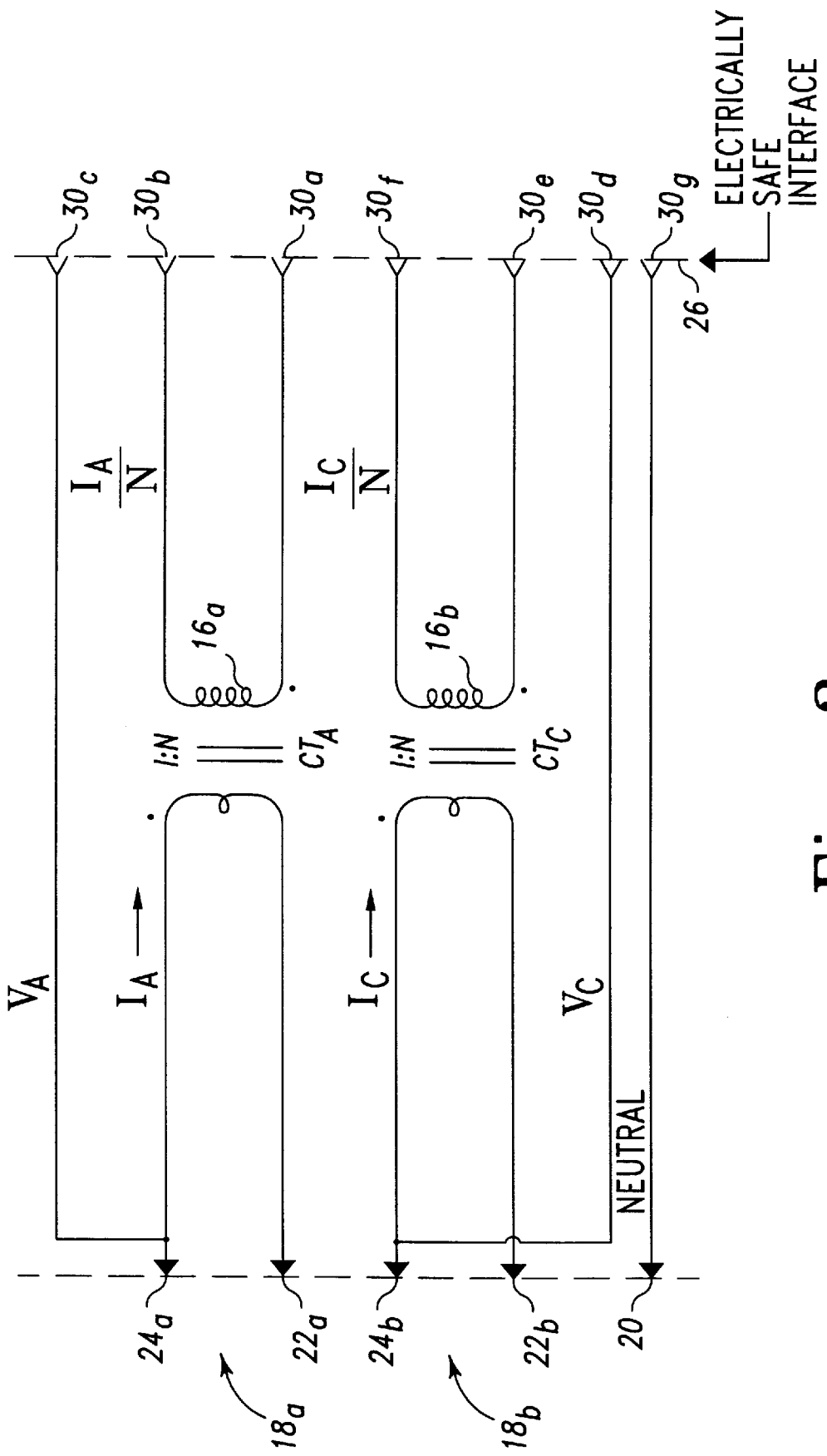
FIG. 3 shows a schematic circuit diagram of the sensor module of the exemplary embodiment of the revenue meter of FIG. 1.

FIG. 3 shows a schematic circuit diagram of the sensor module 12 of the exemplary embodiment shown in FIG. 1. According to the present embodiment, the sockets 30a and 30b provide a connection to the first current transformer 16a, the sockets 30e and 30f provide a connection to the second current transformer 16b, the socket 30c provides a connection to the first current coil 18a, the socket 30d provides a connection to the second current coil 18b, and the socket 30g provides a connection to one or more of the neutral blades 20.

Further detail regarding the physical configuration of the sockets 30a through 30g, as well as the configuration of the top plate 28 is discussed further below in connection with FIG. 5.

Figure 4:
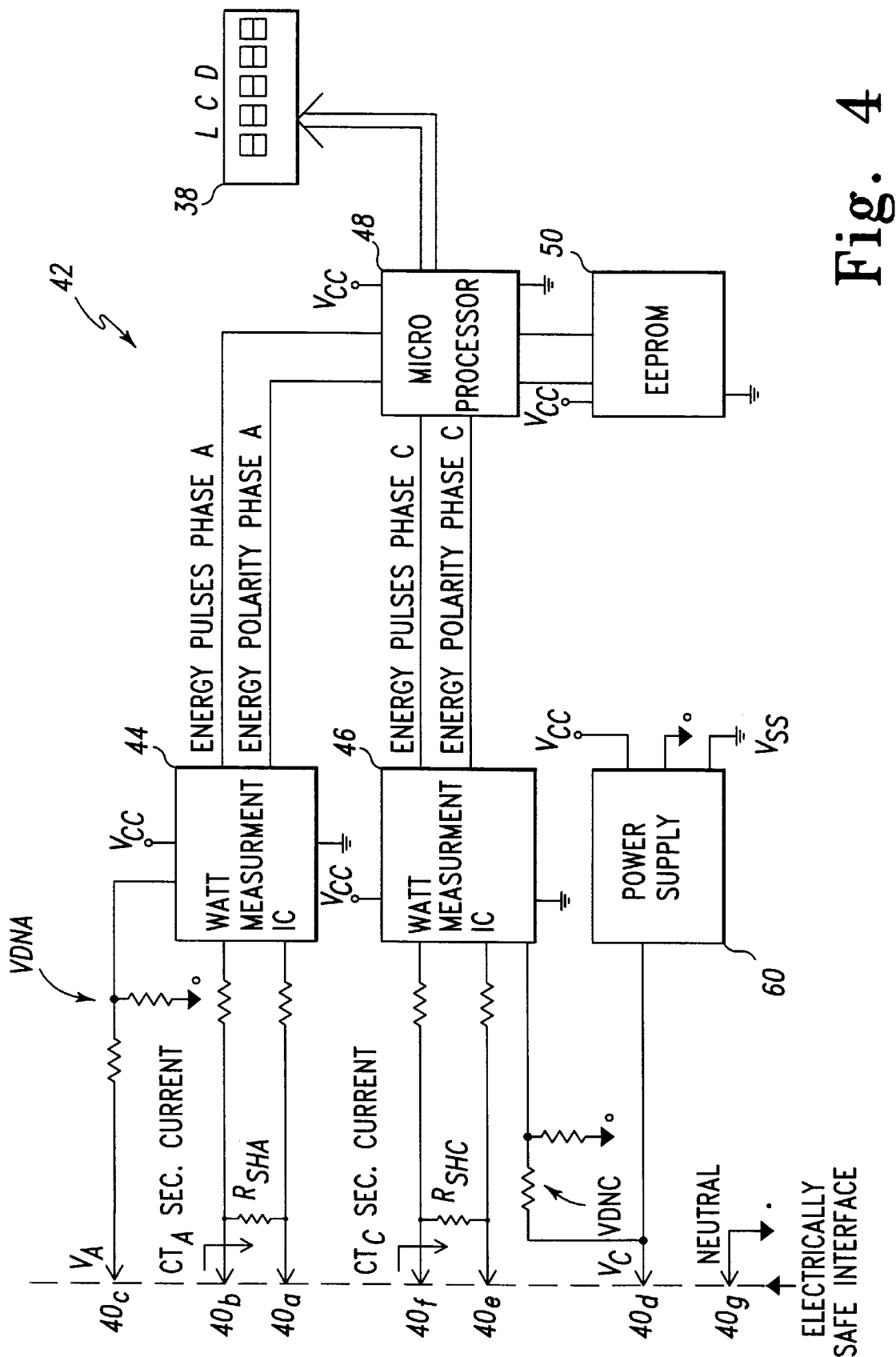
FIG. 4 shows an exemplary measurement circuit and associated display for use on the printed circuit board in the measurement module of FIG. 1.

FIG. 4 shows an exemplary measurement circuit 42 and associated display 38 for use on the printed circuit board 34 in the measurement module 14 of FIG. 1. The measurement circuit 42 includes a first watt measurement integrated circuit ("IC") 44, a second watt measurement IC 46, a microprocessor 48 and a non-volatile memory 50. Plugs 40*a*, 40*b*, and 40*c* are each connected to the first watt measurement IC 44. The first watt measurement IC 44 is a device that receives measurement signals representative of voltage and current signals in an electrical system, and generates an energy pulse signal and a polarity pulse signal therefrom. The energy pulse signal is a stream of pulses wherein the frequency of the pulses is proportional to watt-hours measured. The polarity pulse signal contains information relating to the polarity of the phase A measurement signal. The first watt measurement IC 44 is operable connected to provide energy pulse signals and polarity pulse signals to the microprocessor 48. Circuits suitable for carrying out the functions of the first watt measurement IC 44 are well known.

Plugs 40*d*, 40*e*, and 40*f* are connected to the second watt measurement IC 46. The second watt measurement is device substantially similar to the first watt measurement IC 44. The second watt measurement IC 46 is operable connected to provide energy pulse signals and polarity pulse signals to the microprocessor 48. The microprocessor 48 is further connected to the memory 50 and the display 38.

In the operation of the exemplary meter 10 and meter box configuration described above in connection with FIGS. 1, 2, 3, and 4, energy consumption measurements are carried out in the following manner. As discussed above, the present embodiment is intended for use with a 12S meter form that is generally associated with a three wire network configuration. A three wire network configuration, as is well known in the art, includes a phase A power line, a phase C power line, and a neutral line. The present invention, however, is in no way limited to use in a three wire network configuration. The concepts described may readily be employed in meters used in other configurations, including single phase and other polyphase configurations.

In operation, the plurality of jaws 22 (FIG. 2) provide the phase A power line signal, in other words, the phase A voltage and current, across the blades 22*a* and 24*a* of the first current coil 18*a*, and the phase C power line signal across the blades 22*b* and 24*b* of the second current coil 18*b*. (FIG. 1). Referring to FIG. 3, the phase A current flows from the blade 24*a* through the first current coil 18*a* to the blade 22*a*. The first current coil 18*a* imparts a scaled version of the current, referred herein as the phase A current measurement signal, to the first current transformer 16*a*. The phase A current measurement signal is equal to the current flowing through the current coil 18*a* scaled by a factor of N1, where N1 is the turns ratio of the current transformer 16*a*. The phase A current measurement signal is provided to the sockets 30*a* and 30*b*. The first current coil 18*a* is further operably connected to the socket 30*c* for the purposes of providing the phase A voltage thereto.

Similar to the phase A current, the phase C current flows from the blade 24*b* of the second current coil 18*b* to the blade 22*b*. The phase C current is imposed onto the second current transformer 16*b*, which generates a phase C current measurement signal. Analogous to the phase A current measurement signal, the phase C current measurement signal is the phase C current scaled by a factor of N2, where N2 is the turns ratio of the second current transformer 16*b*. The turns ratios N1 and N2 of the current transformers 16*a* and 16*b*, respectively, are typically substantially similar and preferably equal. However, manufacturing tolerances may result in slight differences in the turns ratios N1 and N2. In any event, the second current transformer 16*b* provides the phase C current measurement signal to the sockets 30*e* and 30*f*. The second current coil 18*b* is operably connected to the socket 30*d* for the purposes of providing the phase C voltage thereto. The neutral blade 20 is connected to provide a connection between the neutral line and the socket 30*g*.

It is noted that potentially hazardous electrical signals reside on one or more of the sockets 30*a* through 30*g*. In particular, the sockets 30*c* and 30*d* provide a direct connection to the external or utility power line, and therefore are potentially extremely dangerous. Moreover, the sockets 30*a*, 30*b*, 30*e*, and 30*f* all include current measurement signals that are potentially dangerous to humans, depending somewhat on the overall power consumption of the facility being metered and the turns ratios N1 and N2. Accordingly, the relatively small physical size of the sockets 30*a* through 30*g* and their corresponding openings greatly inhibits or prevents human contact with the socket connections.

Continuing with the general operation of the meter 10 of FIG. 1, the sockets 30*a* and 30*b* (FIG. 3) provide the phase A current measurement signal to the plugs 40*a* and 40*b*, respectively, of the measurement module (FIG. 4). Likewise, the sockets 30*e* and 30*f* (FIG. 3) provide the phase C current measurement signal to the plugs 40*e* and 40*f*, respectively of the measurement module (FIG. 4). The sockets 30*c* and 30*d* (FIG. 3) provide, respectively, the phase A voltage measurement signal and the phase C voltage measurement signal to the plugs 40*c* and 40*d* (FIG. 4). The neutral plug 30*g* (FIG. 3) is operably connected to the plug 40*g* of FIG. 4.

Referring to FIG. 4, plugs 40*a* and 40*b* provide the phase A current measurement signal to the first watt measurement IC 44. Preferably, a shunt resistor RSHA is connected across the plugs 40*a* and 40*b* in order to convert the phase A measurement signal into a voltage signal having a magnitude and phase that is representative of the measured phase A current. The converter phase A current measurement signal is provided to the first watt measurement IC 44. The socket 40*c* provides the phase A voltage measurement signal through a voltage divider network VDNA to the first watt measurement IC 44. The voltage divider network VDNA reduces the magnitude or, in other words, scales down of the phase A voltage magnitude signal before it is input to the first watt measurement IC 44. It is noted that the voltage divider network VDNA may alternatively be located in the sensor module 12, as opposed to the measurement module 14.

The sockets 40*e* and 40*f*, analogous to the sockets 40*a* and 40*b*, provide the phase C current measurement signal through a shunt resistor RSHC to the second watt measurement IC 46. The socket 40*d* provides the phase C voltage measurement signal through a voltage divider network VDNC to the second watt measurement circuit 46. The socket 40*d* further provides the phase C voltage measurement signal to the power supply 60. The power supply 60 is further connected to the neutral line and operates to provide a biasing voltage to each of the functional block circuits in the measurement module 14.

The first watt measurement IC 44 receives the phase A voltage and current measurement signals, or simply, phase A measurement signals, and generates a phase A energy pulse signal therefrom. To this end, the first watt measurement IC 44 may suitably include an analog to digital ("A/D") converter and a digital signal processing circuit. In such configuration, the A/D converter would sample the phase A measurement signals and provide the digitized phase A measurement signals to the digital signal processing circuit. The digital signal processing circuit would then multiply each phase A voltage measurement sample by each phase A current measurement sample, and accumulate the resulting products over time to obtain an energy measurement in watt-hours. When enough watt-hours accumulate, or in other words, when the accumulated watt-hour measurement exceeds a predetermined threshold, or pulse threshold, the digital signal processing circuit generates a pulse as an output, thereby creating the phase A energy pulse signal. The accumulated watt-hour measurement is then reset to zero. The first watt measurement IC 44 provides the phase A pulse energy signal to the process 48.

The frequency of the pulses in the phase A energy pulse signal is proportional to the amount of energy being consumed. For example, if a relatively large amount of energy is being consumed, then the phase A current measurement signal will have a relatively large magnitude. As a result of such a large current measurement signal, the products of the current and voltage sample multiplication will be relatively large, thereby causing the pulse threshold to be reached in a shorter amount of time. Accordingly, when a large amount of energy is being consumed, the first watt measurement IC 44 will generate pulses more quickly, or in other words, at a higher frequency.

The first watt measurement IC 44 further generates a phase A energy polarity signal. The phase A energy polarity signal consists of the sign of the average valve of the product of the phase A voltage measurement signal and the phase A current measurement signal.

The second watt measurement IC 46 operates in a substantially similar manner as the first watt measurement IC 44. Specifically, the second watt measurement IC 46 receives the phase C voltage and current measurement signals, or simply, phase C measurement signals, and generates a phase C energy pulse signal and a phase C energy polarity signal therefrom. To this end, the second watt measurement IC 46 may suitably be constructed and operate in substantially the same manner as the first watt measurement IC 44.

It will be appreciated that the above descriptions of the operation of the first and second watt measurement ICs 44 and 46, respectively are given by way of example only. Other methods of energy measurement using voltage and current measurement signals are well known and may readily be incorporated to suit the needs of the particular metering application. For example, a single watt measurement IC may be used for both phase A and phase C. Additionally, the watt measurement circuit need not be integrated into a single semiconductor substrate but instead may comprise discrete components. Those of ordinary skill in the art may readily devise their own watt measurement circuit to suit their particular design criteria.

The processor 48 then accumulates the energy pulses from the energy pulse signal to obtain measurement data of energy consumed by the facility to which the meter 10 is connected. The measurement data may then be provided to the display 38.

It is noted that in the exemplary embodiment described herein, the meter 10 is a type of meter commonly known in the industry as a self-contained meter. In a self-contained meter, the current coils of the meter, such as current coils 18a and 18b of the present invention, carry the entire current load of the electrical system. As a result, in a typical meter, if the meter is removed for repair or replacement, the current coils are removed from the jaws of the meter box, and power to the facility is interrupted. A distinct advantage of the present invention is that the measurement module 14 may be removed for repair, replacement or upgrade without removing the current coils 18a and 18b. As a result, the facility experiences no electrical service interruption during the replacement.

Figure 5:
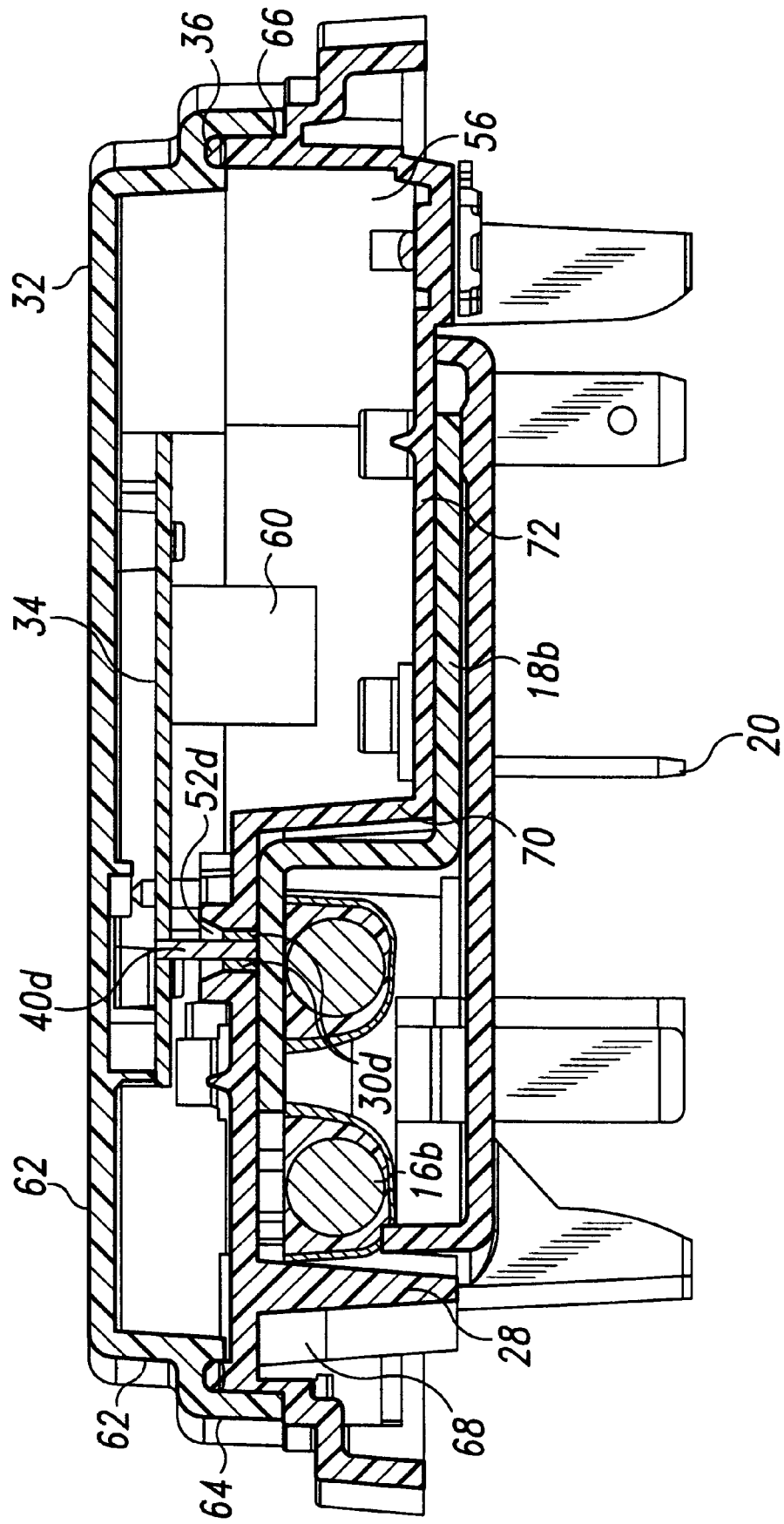
FIG. 5 shows a side view cutaway of the exemplary embodiment of the revenue meter of FIG. 1.

FIG. 5 shows a side view cutaway of the meter 10 wherein the measurement module 14 is assembled onto the sensor module 12. The face cover 32 of the measurement module 14 includes a cylindrical portion 62 and an annular skirt 64. The top plate 28 of the sensor module 12 is defined in part by an annular ridge 66. The annular ridge 66 is received by a space defined in between the annular skirt 64 and the cylindrical portion 62 of the meter cover 32. The top plate 28 is further defined by a shelf 68 that is substantially flat and abuts, in part, the cylindrical portion 62. The shelf 68 constitutes approximately one-half of the top plate 28. The other half of the top plate 28 consists of a depression 56 defined by a drop 70, a bottom 72 and a portion of the annular ridge 66. The drop 70 defines the change in depth between the shelf 68 and the bottom 72.

The depression 56 defines a space that allows for large components on the printed circuit board 34 to extend downward from the measurement module 14 below the cylindrical portion 62. In the illustrated example, components of the power supply 60 extend below the cylindrical portion 62 to occupy at least a portion of the depression 56. The two level configuration of the top plate created by the depression 56 of the sensor module 12 more efficiently utilizes the space within the meter 10. By contrast, prior art modular meters included a substantially flat interface between the sensor module and electronics module, which creates wasted space in both modules. The present invention, by arranging for the bulky components to occupy complementary portions of the meter and using an interface that includes a depression, space within the meter is more efficiently utilized.

As illustrated in FIGS. 1 and 5, the current transformer 16b is arranged to be horizontally disposed, or in other words, has an axial dimension that is parallel to the axial dimension of the face cover 32. As illustrated in FIG. 1, the first current transformer 16a is similarly disposed. The horizontally disposed current transformers 16a and 16b provide significant space reduction advantages over vertically-disposed current transformers. In an electric utility meter, the horizontal footprint, for example, the length and width or diameter, is defined predominantly by the meter mounting equipment. For example, the plurality of jaws 22 of FIG. 2 define at least a minimum length and width, or in this case using a circular meter shape, a minimum diameter. The meter box, such as the meter box 15 of FIG. 2 may also dictate the minimum diameter. Accordingly, the only space reduction that is practical is in the thickness or depth dimension. By disposing the current transformer 16b horizontally, the smallest dimension of the current transformer 16b, its axial thickness, is aligned in the only dimension of the meter that can be reduced. Accordingly, the horizontally-disposed current transformers 16a and 16b further reduce the overall size of the meter 10.

As discussed above the top plate 28 also includes a plurality of openings, illustrated in FIG. 5 by the exemplary opening 52d. The opening 52d corresponds to the socket 30d, and similar openings exist that correspond to each of the other sockets 30a, 30b, 30c, 30e, 30f and 30g. (See FIG. 1) The opening 52d is preferably slightly conical to allow for alignment adjustment of the plug 40d during assembly of the measurement module 14 onto the sensor module 12. The socket 30d, which may suitably be a spring loaded terminal, is electrically connected to the current coil 18b for the purposes of providing a connection to the phase C voltage measurement, as discussed above in connection with FIG. 1.

FIG. 5 further shows the plug 40d connected to the circuit board 34 and inserted through the opening 52d and into the socket 30d. The socket 30d physically engages the plug 40d in such a manner as to provide an electrical connection therebetween. The plug 40d may suitably be an ordinary conductive pin.

It can thus be seen by reference to FIGS. 1, 2 and 5, that the electrically safe interface or top plate 28, when fitted to a cooperating meter housing, provides a substantially solid barrier between a human operator or technician and the current and voltage sensing devices when the measurement module 14 is removed for repair or replacement. The only openings are the openings, for example, opening 52d, that correspond to the sockets 30a through 30g to permit the plugs 40a through 40g to connect to the sockets 30a through 30g. Such openings are sufficiently small enough, and the sockets are sufficiently recessed within the openings, to prevent an operator from coming into direct contact with dangerous high voltages.

It will be appreciated that other interconnection means may be employed in the sensor module 12 and measurement module 14 that will nevertheless provide an electrically safe interface. For example, wireless means may be used as the interconnection means. Such wireless means could provide voltage and current measurement signals from the sensor module 12 to the measurement module 14. For example, the measurement module 14 could include sensitive electric and magnetic field sensors that obtain voltage and current measurement information from electromagnetic radiations from the current coils 18a and 18b. Likewise, optical communication means may be used to provide measurement signal information from the sensor module 12 to the measurement module. In any case, the electrically safe interface would typically include a barrier such as the top plate 28 that prevents physical access by a human operator to the current coils 18a and 18b and other dangerous portions of the sensor module 12 when the measurement module 14 is removed.

To fully obtain the benefits of modularity, it is necessary to address calibration issues in the design of the meter 10. Specifically, the sensor portion 12 of the meter must have a calibration feature that allows it to be used in connection with any suitable measurement portion. In non-modular meters, the measurement circuit is often specifically calibrated for use with a particular voltage and current sensing means. The reason for the specific calibration is that there can be large variations in signal response of each voltage and current sensing means. In particular, the current sensing devices, such as current transformers, often have a widely variable signal response. The signal response of commonly available current transformers varies widely in both magnitude and phase response.

The signal response of such current transformers varies to a much greater extent than the energy measurement accuracy of the meter. In other words, while the current transformer signal response may vary as much as 10%, the overall accuracy of the meter is required to be much less than 10%. Accordingly, compensation must be made for the variance, or tolerance, of the current sensing devices to ensure that the ultimate energy measurement accuracy of the meter is within acceptable tolerances. The compensation is typically carried out in the prior art by adjusting or calibrating the measurement circuit during manufacture to account for the signal response characteristics of the current sensing devices that will be used in a particular meter unit. In other words, each measurement circuit is custom-calibrated for each meter.

A truly modular meter, however, cannot require such extensive unit-specific calibration. Instead, the modular components must be readily interchangeable. Accordingly, referring again to FIG. 1, the sensor module 12 is pre-calibrated for modularity, such that the sensor module 12 may be coupled with any measurement module 14 without requiring unit-specific calibration of that measurement module 14.

To this end, the sensor module 12, and specifically the voltage and current sensing means 15 is pre-calibrated such that the voltage and current sensing means has a signal response within a tolerance of a predefined signal response that is no greater than the tolerance of the energy measurement accuracy of the meter 10. The energy measurement accuracy of the meter 10 is defined as the accuracy of the measured energy consumption with respect to the actual energy consumption of the facility. Thus, if the tolerance of the energy measurement accuracy of the meter is required to be 0.5%, then the difference between the measured energy consumption and the actual energy consumption will not exceed 0.5%. In such a case the tolerance of the signal response of the voltage and current sensing means will be no more than, and typically substantially less than, 0.5%. As a result, the measurement module 14 may readily be replaced with another measurement module without requiring specific calibration of the replacement measurement module.

The pre-calibration of the voltage and current sensing means 15 may be accomplished using careful manufacturing processes. The primary source of variance in the signal response of the voltage and current sensing means 15 is the signal response of the current transformers 16a and 16b. Generally available current transformers are prone to variance in both magnitude and phase angle signal response. Accordingly, pre-calibration involves using current transformers that are manufactured to perform within the required tolerances. As an initial matter, the current transformers 16a and 16b are manufactured using a high permeability core material, which reduces phase angle variance in the signal response. More over, the current transformers 16a and 16b are manufactured such that the actual number of turns is closely controlled. Close manufacturing control over the number of turns in the current transformers 16a and 16b produces sufficient consistency in the magnitude signal response to allow for interchangeability.

Alternatively, if controlling the number of turns during initial manufacturing is not desirable for cost reasons, then turns may be added or removed after manufacturing to achieve the desired signal response. For example, it may be more cost effective to buy wide tolerance commercially available current transformers and adjust the number of turns than to have sufficiently narrow tolerance current transformers specially manufactured.

In any event, the meter 10 described above in connection with FIGS. 1 through 5 provides features and advantages to servicing, upgrading, and repairing revenue meters. Accordingly, the present invention includes method of servicing an electronic utility meter in a manner that does not interrupt the electrical service to the facility being metered.

Referring to FIG. 2, the servicing method described herebelow involves servicing the meter 10, which is installed in the meter box 15, which in turn is attached to the electrical system of the facility being metered, not shown. The types of servicing that may be accomplished by the following method include replacement of the measurement module 14, repair of the measurement module 14, and upgrading of the measurement module 14. Because the components of the measurement module 14 have higher complexity, a large proportion of the repair, replacement, and upgrade activity that is potentially possible with respect to the meter 10 will involve only the measurement module.

Typically, a technician first removes the measurement module 14 of the electronic utility meter 10 from the sensor module 12 while the cover 18 remains installed over the sensor module 12 and onto the housing 16. The measurement module 14 operates having a first level of performance which requires replacement, repair, or upgrading, to a second level of performance. When the measurement module 14 is removed, the sensor module 12 remains electrically connected to the electrical system of the facility, thereby allowing electrical power to be delivered to the facility.

The technician then replaces the measurement module 14 with a replacement measurement module having a second level of performance. The replacement measurement module may suitably be the same measurement module 14 wherein the technician has performed operations, such as repair, upgrade, or component replacement, to create the replacement module having the second level of performance.

An exemplary upgrade operation includes upgrading the measurement circuit 42 (see FIG. 4) to add features or capabilities. Revenue meters are often capable of sophisticated self-diagnostics, demand metering, time-of-use metering, and communication functionalities. Sometimes, the owner of the facility being metered, or the utility providing the electrical power, desires to improve the capabilities of an existing meter. The capabilities may be improved by upgrading the measurement circuit 42. In such a case, the first level of performance defines the original performance capabilities and the second level of performance includes additional capabilities.

An exemplary repair operation may include the replacement of components. At times, one or more components of the measurement module 14 will fail, in which case, the first level of performance may be an inoperative level of performance. In such a case, the method described above further comprises performing an operation including replacing the at least one inoperative component to create the replacement module having a second level of performance.

In yet another exemplary operation, the above method may include replacing the measurement module 14 with an entirely different measurement module. If the measurement module 14 requires repair or upgrade, it is often desirable to simply replace the measurement module 14 having the first level of performance with another measurement module that has the second level of performance.

In any of the above described servicing scenarios, the power to the facility need not be interrupted. This provides a significant advantage over prior art methods of servicing meters that required a power service over prior art methods of servicing meters that required a power service interruption to repair or replace meter components. The above method is not limited to use in connection with the exemplary embodiment described above, but is suitable for use in connection with any modular meter that includes an electrically safe interface between the module to be removed, for example, the measurement module, and the module that is not removed, for example, the sensor module.

It will be understood that the above embodiments are merely exemplary, and that those of ordinary skill in the art may readily devise their own implementations that incorporate the principles of the present invention and fall within the spirit and scope thereof. For example, while the meter 10 includes a display 38, other means for communicating energy consumption data may alternatively be employed, such as serial or parallel communication lines to an external computer or module, on-board printing devices, and audible communication devices.

Moreover, the present invention is in no way limited to meters that utilize current transformers and current coils as voltage and current sensing means. The principles and advantages of the present invention are readily incorporated into meters utilizing voltage and current sensing means that include current shunt sensing devices, inductive current pickup devices, Hall-effect current sensors, and other well-known voltage and current sensing devices.

What is claimed:

1. An electronic utility meter comprising:
   a) a sensor module for connecting to the electrical system of a facility, said sensor module having an interior including voltage and current sensing means, said voltage and current sensing means operable to receive voltage and current signals from the electrical system and generate measurement signals therefrom, the sensor module further having first interconnecting means;
   b) a measurement module including a measurement circuit operable to receive measurement signals and generate energy consumption data therefrom, said measurement module including means for communicating information relating to the energy consumption data, said measurement module further containing second interconnecting means;
   wherein said first interconnecting means and said second interconnecting means cooperate to connect the measurement circuit to the voltage and current sensing means, and wherein said first interconnecting means includes means for preventing physical contact of a human operator with at least a part of the voltage and current sensing means that carries potentially hazardous electrical signal levels.

2. The electronic utility meter of claim 1 wherein the means for preventing physical contact comprises a top plate that substantially covers the interior of the sensor module.

3. The electronic utility meter of claim 2 wherein the second interconnecting means includes a plurality of plugs and the first interconnecting means includes a plurality of sockets for receiving said plurality of plugs, and wherein the top plate includes a plurality of openings situated in a coordinated relationship with the plurality of sockets to allow the plurality of plugs to be received in the plurality of sockets through the plurality of openings.

4. The electronic utility meter of claim 3 wherein the plurality of openings each have a first dimension and a second dimension, the first dimension having at least the same size as the second dimension, and wherein the second dimension is less than ⅛ inch, thereby preventing substantial access of a human operator through the openings.

5. The electronic utility meter of claim 2 wherein the top plate includes a plurality of openings situated to allow the first interconnecting means and said second interconnecting means to cooperate to connect the measurement circuit to the voltage and current sensing means.

6. The electronic utility meter of claim 5 wherein the plurality of openings each have a first dimension and a second dimension, the first dimension having at least the same size as the second dimension, and wherein the second dimension is less than ⅛ inch, thereby preventing substantial access of a human operator through the openings.

7. The electronic utility meter of claim 1 wherein the sensor module is operable to be received by a cooperating meter box, the meter box having a housing and a meter box cover, and the sensor module is further operable to receive a meter box cover, such that the meter box cover and said means for preventing physical contact cooperate to prevent the physical contact to at least a portion of the voltage and current sensing means.

8. The electronic utility meter of claim 1 wherein the voltage and current sensing means further comprises a pre-calibrated voltage and sensing means having a signal response, said signal response having a tolerance no greater than a tolerance of an energy measurement accuracy of the electronic utility meter.

9. The electronic utility meter of claim 1 wherein the voltage and current sensing means includes:
   a plurality of current coils each having a first and second end, said first and second end each terminating in a blade; and
   a plurality of current transformers in a current sensing relationship to the current coils, wherein said current transformers are electrically connected to the first interconnecting means.

10. The electronic utility meter of claim 9 wherein the sensor module and the measurement module each have an axial dimension, a radial dimension, and wherein the plurality of current transformers each comprise a toroid having a substantially circular shape, and wherein the axis defined by each toroid is parallel to the axial dimension of the sensor and measurement module.

11. An electronic utility meter comprising:
   a) a sensor module for connecting to the electrical system of a facility, said sensor module including voltage and current sensing means, said voltage and current sensing means operable to receive voltage and current signals from the electrical system and generate measurement signals therefrom, said sensor module further comprising an electrically safe interface;
   b) a removable measurement module including a measurement circuit operable to receive measurement signals and generate energy consumption data therefrom, said measurement module including a means for communicating information relating to the energy consumption data;
   wherein said electrically safe interface operably connects the voltage and current sensing means to the measurement circuit, said electrically safe interface further preventing physical contact of a human operator with the received voltage and current signals from the electrical system when the measurement module is removed from the sensor circuit.

12. The electronic utility meter of claim 11 wherein the electrically safe interface includes a top plate that is integral with and substantially covers the interior of the sensor module.

13. The electronic utility meter of claim 11 wherein the measurement module includes a plurality of plugs connected to the measurement circuit and the electrically safe interface includes a plurality of sockets for receiving said plurality of plugs, said plurality of plugs integral with the sensor housing.

14. The electronic utility meter of claim 13 wherein the electrically safe interface includes a top plate that is integral with and substantially covers the interior of the sensor module, and wherein the top plate includes a plurality of openings situated in a coordinated relationship with the plurality of sockets to allow the plurality of plugs to be received in the plurality of sockets through the plurality of openings.

15. The electronic utility meter of claim 14 wherein the plurality of openings each have a first dimension and a second dimension, the first dimension having at least the same size as the second dimension, and wherein the second dimension is less than 1/8 inch, thereby preventing substantial access of a human operator through the openings.

16. The electronic utility meter of claim 11 wherein the sensor module is operable to be received by a cooperating meter box, the meter box having a housing and a meter box cover, and the sensor module is further operable to receive a meter box cover, such that the meter box cover and the electrically safe interface cooperate to prevent the physical contact of a human operator with the voltage and current signals received from the electrical system.

17. The electronic utility meter of claim 11 wherein the voltage and current sensing means includes:
   a plurality of current coils each having a first and second end, said first and second end each terminating in a blade; and
   a plurality of current transformers in a current sensing relationship to the current coils.

18. The electronic utility meter of claim 11 wherein the voltage and current sensing means further comprises a pre-calibrated voltage and sensing means having a signal response, said signal response having a tolerance no greater than a tolerance of an energy measurement accuracy of the electronic utility meter.

19. The electronic utility meter of claim 17 wherein the sensor module and the measurement module each have an axial dimension, a radial dimension, and wherein the plurality of current transformers each comprise a toroid having a substantially circular shape, and wherein the axis defined by each toroid is parallel to the axial dimension of the sensor and measurement module.

20. A method of servicing an electronic utility meter, said utility meter operably connected to an electrical system of a facility for the purposes of measuring a power consumption of the facility, said method comprising:
   a) removing a measurement module of the electronic utility meter from a sensor module of the electronic utility meter while the sensor module is electrically connected to the electrical system and while said electrical system is providing power to the facility, said sensor module including voltage and current sensing means, said voltage and current sensing means operable to receive voltage and current signals from the electrical system and generate measurement signals therefrom, wherein said measurement module includes a measurement circuit operable to receive measurement signals and generate energy consumption data therefrom, said measurement module including a display for displaying information relating to the energy consumption data, said measurement module having a first level of performance; and
   b) replacing the measurement module with a replacement module having a second level of performance.

21. The method of claim 20 further comprising a step c), performed prior to step b), of performing an operation on the measurement module having a first level of performance to create the replacement module having a second level of performance.

22. The method of claim 21 wherein step c) further comprises performing an operation including upgrading the measurement circuit to create the replacement module having a second level of performance.

23. The method of claim 21 wherein the measurement module includes at least one inoperative component and step c) further comprises performing an operation including replacing the at least one inoperative component to create the replacement module having a second level of performance.

24. The method of claim 20 wherein the measurement module having a first level of performance comprises a first measurement module and the replacement measurement module comprises a second measurement module and step b) further comprises replacing the first measurement module with the second measurement module.

25. An electronic utility meter comprising:

a) a sensor module for connecting to the electrical system of a facility, said sensor module having an interior including voltage and current sensing means, said voltage and current sensing means operable to receive voltage and current signals from the electrical system and generate measurement signals therefrom, the sensor module including an interface;

b) a removable measurement module including a measurement circuit operable to receive measurement signals and generate energy consumption data therefrom, said measurement module including a display for displaying information relating to the energy consumption data;

wherein the interface operably connects the measurement circuit to the voltage and current sensing means, said interface having a depression defined in part by the configuration of the voltage and current sensing means, said depression forming a recess space exterior the sensor module for receiving at least a portion of the measurement module.

26. The revenue meter of claim 25 wherein the interface further comprises an electrically safe interface, said electrically safe interface operable to prevent physical contact of a human operator with the interior of the sensor module when the measurement module is removed from the sensor circuit.

27. The electronic utility meter of claim 25 wherein the voltage and current sensing means includes:

a plurality of current coils each having a first and second end, said first and second end each terminating in a blade; and a plurality of current transformers in a current sensing relationship to the current coils.

28. The electronic utility meter of claim 27 wherein the sensor module and the measurement module each have an axial dimension, a radial dimension, and wherein the plurality of current transformers each comprise a toroid having a substantially circular shape, and wherein the axis defined by each toroid is parallel to the axial dimension of the sensor and measurement module.

29. The electronic utility meter of claim 26 wherein the sensor module is operable to be received into an interior of a meter box, the meter box having a housing and a meter box cover, and the sensor module is further operable to receive a meter box cover, such that the meter box cover and said electrically safe interface cooperate to prevent physical contact by a human operator with the interior of the meter box.

* * * * *